United States Patent
Mortan

(10) Patent No.: US 11,600,557 B2
(45) Date of Patent: Mar. 7, 2023

(54) PACKAGED DEVICE HAVING SELECTIVE LEAD PULLBACK FOR DIMPLE DEPTH CONTROL

(71) Applicant: Texas Instruments Incorporated, Dallas, TX (US)

(72) Inventor: Robert F. Mortan, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 259 days.

(21) Appl. No.: 16/404,615

(22) Filed: May 6, 2019

(65) Prior Publication Data
US 2020/0066618 A1 Feb. 27, 2020

Related U.S. Application Data

(60) Provisional application No. 62/720,181, filed on Aug. 21, 2018.

(51) Int. Cl.
*H01L 23/495* (2006.01)
*H01L 21/56* (2006.01)
*H01L 23/31* (2006.01)

(52) U.S. Cl.
CPC ...... *H01L 23/49544* (2013.01); *H01L 21/565* (2013.01); *H01L 23/3121* (2013.01); *H01L 23/49524* (2013.01); *H01L 23/49575* (2013.01)

(58) Field of Classification Search
CPC .......... H01L 23/49544; H01L 23/3121; H01L 23/49524; H01L 23/49575; H01L 23/49548; H01L 23/49565; H01L 21/565
See application file for complete search history.

(56) References Cited

U.S. PATENT DOCUMENTS

| | | | |
|---|---|---|---|
| 2005/0139982 A1* | 6/2005 | Fukaya | H01L 23/49548 257/690 |
| 2006/0017143 A1* | 1/2006 | Shimanuki | H01L 24/97 257/E21.504 |
| 2009/0200656 A1* | 8/2009 | Shimanuki | H01L 23/49548 257/690 |
| 2011/0244629 A1* | 10/2011 | Gong | H01L 21/4828 438/112 |
| 2016/0254214 A1* | 9/2016 | Makino | H01L 24/32 257/676 |
| 2018/0033647 A1 | 2/2018 | Bin Mohd Arshad et al. | |

OTHER PUBLICATIONS

*Deering v. Winona Harvester Works*, 155 U.S. 286, 15 S. Ct. 118, 39 L. Ed. 153 (1894), Court Opinion (Year: 1894).*

* cited by examiner

*Primary Examiner* — Matthew E. Gordon
(74) *Attorney, Agent, or Firm* — Ronald O. Neerings; Frank D. Cimino

(57) ABSTRACT

A packaged semiconductor device includes a lead frame including plurality of lead terminals each having a plated wettable flank dimple including 2 or more different widths including narrower lead terminals and wider lead terminals. A semiconductor die is attached to the lead frame. A mold material terminates at a saw line of the packaged semiconductor device providing encapsulation except for an exposed bottom contact and an exposed sidewall contact for the plurality of lead terminals. The wider lead terminals have a necked region with a reduced width extending inward a predetermined distance from the saw line, where a terminal region inward beyond the necked region which is wider as compared to the necked region.

22 Claims, 7 Drawing Sheets

(PRIOR ART) SIDE VIEW

BOTTOM VIEW

BOTTOM VIEW

PACKAGED DEVICE HAVING SELECTIVE LEAD PULLBACK FOR DIMPLE DEPTH CONTROL

CROSS REFERENCE TO RELATED APPLICATIONS

This application claims the benefit of Provisional Application Ser. No. 62/720,181 entitled "Pre-Plated/Pre-Etched Wettable Flank Dimple Depth Control on Variable Lead Widths in Hot Rod Packaging" filed on Aug. 21, 2018, which is herein incorporated by reference in its entirety.

FIELD

This Disclosure relates to a packaged semiconductor device having a lead frame with lead terminals that have wettable flank dimples.

BACKGROUND

To ensure that today's needs such as for automobile's demand for safety and high reliability, the automotive industry requires original equipment manufacturers (OEMs) to perform a 100% automatic visual inspection (AVI) post-assembly for packaged semiconductor devices. In the case of quad-flat no-lead (QFN) packages, due to the method in which packaged semiconductor devices such as QFN packages are singulated conventionally being with a saw blade, the surface of the exposed lead terminal (or 'pin') flank is flush with the molding compound such that solder does not readily climb-up (or "wick") the flank (or side-walls) of the lead terminals, so that the QFN package is not 'flank wettable'. There is also generally no easily viewed solderable or exposed lead terminals that enables one to determine whether or not the package is successfully soldered onto pads a substrate that is conventionally a printed circuit board (PCB). The exposed copper lead surfaces are prone to oxidation, making sidewall solder wetting more difficult.

With QFN device packages, the sidewall solder coverage can vary from 0% to 100%. Original equipment manufacturer (OEMs) incur additional costs due to yield issues from false QFN assembly failures, along with genuine failures where the packaged device assembly process has highlighted actual poor solder joints. The use of an X-ray machine to check for a good solder joint between the lead terminals and the substrate adds further expense, and in some cases may not be available.

To resolve the issue of side lead terminal solder wetting of leadless packages for primarily automotive and commercial component manufacturers, two different wettable flank processes which form dimples in the lead terminals are known, with each process providing a visual indicator of solderability which lowers the inspection time. The sawn wettable flank assembly process includes an additional step where the lead terminals of the leadless packaged device are step-cut to form a solderable side wall feature, and are then re-plated with a non-oxidizable metal plating, such as comprising matte tin (Sn), on one half of the sidewall of the lead terminals. Tin (or other plating metal) plating provides a protective cover over the exposed metal which is generally copper to prevent its oxidation.

During the PCB assembly process, due to the presence of plated dimples, the solder joint will extend from the underside of the lead terminal to 'wick' up the plated wettable sidewall of the lead terminal, resulting in an enhanced solder joint between the packaged device and the PCB. AVI can then assess whether there is sufficient solder coverage under each lead terminal of the device. The presence of a side fillet of solder over the dimple indicates a higher probability of a complete solder joint between the bottom of lead terminals and the land pads on the substrate.

The second known wettable flank process is a pre-etched, pre-plated dimple of sufficient depth to yield a side lead solder fillet. This feature is created by a double etch process using dry film masking and standard copper etchant chemistry. This feature comes included with a raw pre-plated lead frame, which may be plated with NiPdAu. After die attach then molding, the package can be singulated by a saw or be punch singulated.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes when a leadless packaged device such as a QFN packaged device includes a variable lead width so that there are some wider lead terminals and some narrower lead terminals, the use of a lead frame with a pre-plated metal (e.g., NiPdAu plating) with a pre-etched wettable flank dimple may not meet typical industry dimple width requirements. In one specific example, the lead terminal width ratio between wider and narrower lead terminals is about 2:1. This problem is recognized to be present because the varying lead terminal widths may cause the wet etchant typically used to etch the wettable flank dimples to either (i) over etch by etching through the width of the narrower lead terminals or (ii) under-etch the wider lead terminals so that the minimum width dimension (WF) of the wettable flank dimple to lead terminal width (b) referred to herein as the WF/b ratio specification (that is generally set by the customer) to ensure proper solder wetting is not met (i.e., is non-compliant).

The WF/b ratio being non-compliant relative to a customer's minimum WF/b specification results because the wider lead terminals having a relatively large b value may not meet this minimum WF/b specification. A wettable flank dimple height (h) of generally 100 μm (=0.100 mm) at a minimum for lead terminals may also be challenging requirements for some customers. This solder wetting problem for plated wettable flank leads in the case of variable lead terminal widths exist for both flip chip and for wire bonded leadless packaged devices, such as QFN devices.

It is also recognized the causes of the above-described problem regarding wettable flank leads with pre-plating of metal is the lead frame design, etching rates and the etching aspect ratios. The lead terminal metal etch rates generally cannot change without inducing adverse results on the narrower lead terminals. However, is recognized that the aspect ratios and lead terminal designs can be changed. This Disclosure changes both the aspect ratios and the lead terminal designs. No known solution exists to enable a wettable flank dimple for pre-metal plated lead terminals that have two or more different b values, with the lead terminals varying in lead width herein meaning at least a 15% difference in the b value relative to the wider lead terminals, typically being at least a 50% width difference relative to the narrower lead terminal.

This Disclosure solves the above-described wettable flank leads with pre-plating of metal problem for all leadless package devices with wettable flank dimples that have lead terminal designs with at least two different b values by before dimple etching equalizing the aspect ratios of the lead terminals using a selective metal "necking etch" along the edge of the package for only the wider lead terminals. The resulting necked regions extend inward to a predetermined distance from the package saw line. The selective necking etch is generally a top side etch process. Disclosed selective necking can be achieved with a dry mask pattern for forming disclosed "necked regions" which feature a lead pullback for selectively reducing the b value for only the wider lead terminals extending inward for a predetermined distance, such as to a predetermined distance of about 100 μm. Disclosed selective necking is implemented before forming the wettable flank dimples for all the lead terminals, for which metal plating follows.

Disclosed aspects include a packaged semiconductor device that comprises a lead frame including plurality of lead terminals each having a plated wettable flank dimple including two or more different terminal widths including narrower lead terminals and wider lead terminals. A semiconductor die is attached to the lead frame. A mold material terminates at a saw line on a bottom of the packaged semiconductor device which provides encapsulation except for an exposed bottom contact and an exposed sidewall contact for the lead terminals. The wider width lead terminals have a necked region with a reduced lead width extending inward an in-plane direction (the x or y direction) for a predetermined distance from the saw line, and a terminal region beyond the necked region which is wider as compared to the necked region.

BRIEF DESCRIPTION OF THE DRAWINGS

Reference will now be made to the accompanying drawings, which are not necessarily drawn to scale, wherein:

In FIGS. 2A and 2B the lead terminal surfaces remaining exposed by the mold compound are all plated. The generic dimensional attributes of the dimples are shown as $b_1$, $b_2$, WF. Hidden lead terminal features are shown as dashed lines.

DETAILED DESCRIPTION

Figure 1:
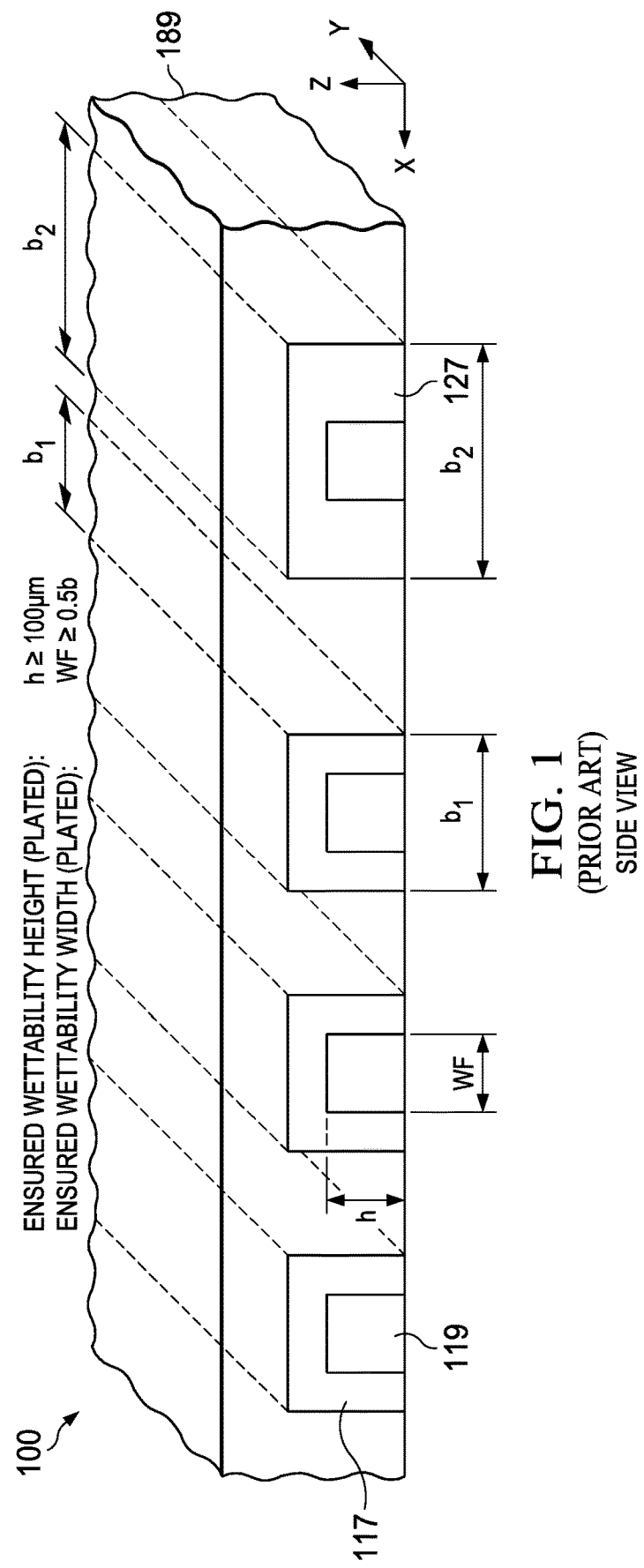
FIG. 1 explains in a simplified manner the lead terminal geometry features for wettable flank dimple lead terminals with a side view of a packaged leadless device having wider and narrower lead terminals.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Disclosed selective necking etch of the wider lead terminals to provide necked regions with a reduced b value over only the predetermined distance extending inward from saw line of the package enables wettable flank dimple etching to provide an essentially constant and compliant WF/b ratio for all the lead terminals of the device. An essentially constant b value enables a subsequent dimple etch to provide an essentially constant and compliant height (h) value (along the z-axis), and an essentially constant and a compliant WF/b ratio. One example particular WF/b ratio specification is WF/b≥0.5, so that is recognized herein an essentially compliant h and WF/b ratio are only generally possible if the b value at the edge of the package extending inward a predetermined distance is fixed for all lead terminals as essentially a single constant value.

Accordingly, the WF/b ratio should remain consistent for all the lead terminals in the lead frame design with the narrowest lead terminals setting the limiting lower b value used by all lead terminals. Because disclosed selective necking extends in the lateral dimension (x, or y direction depending on the side the lead terminals are located for the package) inward from the package edge only to the predetermined distance, the originally wider lead terminals in the final leadless packaged device also have a wider (original) lead terminal width for what is termed herein a "terminal region" that is beyond the predetermined distance, and have a disclosed necked region with the reduced b value along the outer edges of the package for edges of the wider lead terminals where needed in the packaged device design to satisfy the customer' wettable flank dimple requirements (e.g., WF/b≥0.5).

FIG. 1 explains in a simplified manner the lead terminal geometry features for wettable flank dimple lead terminals with a side view 100 of a packaged leadless device having both wider and narrower lead terminals. Mold compound is shown as 189. Narrower lead terminals 117 are shown and one wider lead terminal 127 is also shown. The lead terminals 117, 127 all both have a constant lead width, being shown as $b_1$ for narrower lead terminal 117 and $b_2$ for wider lead terminals 127, (where $b_2 > b_1$) respectively, over their length shown in the Y direction from the edge of the package. The nomenclature used herein is shown with b values for the lead terminals, and WF for the wettable flank dimples.

Typical customer requirements for the dimple height h oriented in the Z direction and WF/b for wettable flank dimples are also shown. The plated wettable flank dimple 119 therein has a height dimension h that is oriented in the Z-direction and a dimple width WF. Because the edge shown in the side view is a sawn edge, the respective lead terminal metal surrounding the plated wettable flank dimple 119 on this edge are not plated. In this Disclosure, unless otherwise stated, all lead terminal metal is plated.

An essentially constant/compliant h value of typically 100 μm minimum and a WF/b ratio of typically ≥0.50 for the plated wettable flank dimples 119 is recognized herein to be possible for all the lead terminals of a packaged semiconductor device having two or more lead terminal widths generally only if the b values shown as $b_1$ and $b_2$ on their ends (where the wettable flank dimples are formed in) are essentially fixed across the packaged semiconductor device as a single constant. As known in the art, the lead terminals will generally comprise a metal such as copper.

Because a constant b is not possible in conventional leadless lead frame designs that have two or more different lead widths disclosed selective necking at the outer edge of the wider lead terminals to form disclosed necked regions extending inward a predetermined distance from the edge of the lead frame is used before the dimple etch for forming the wettable flank dimples. Disclosed necked regions being used only for the wider lead terminals allows the subsequent dimple etch used to form the wettable flank dimples to provide a consistent/compliant h and a consistent WF/b ratio for a lead frame having two or more different lead terminal widths.

Example customer requirements for automated optical inspection (AOI) capable solutions are shown in FIG. 1 as h≥100 µm and WF/b≥0.5. AOI is known to be an automated visual inspection of a printed circuit board (PCB), liquid crystal display (LCD) or other device such as a transistor, where a camera autonomously scans the packaged device under test for both catastrophic failures (e.g. a missing component) and quality defects (e.g. insufficient solder fillet size or an unacceptable shape, or a component skew).

Figure 2A:
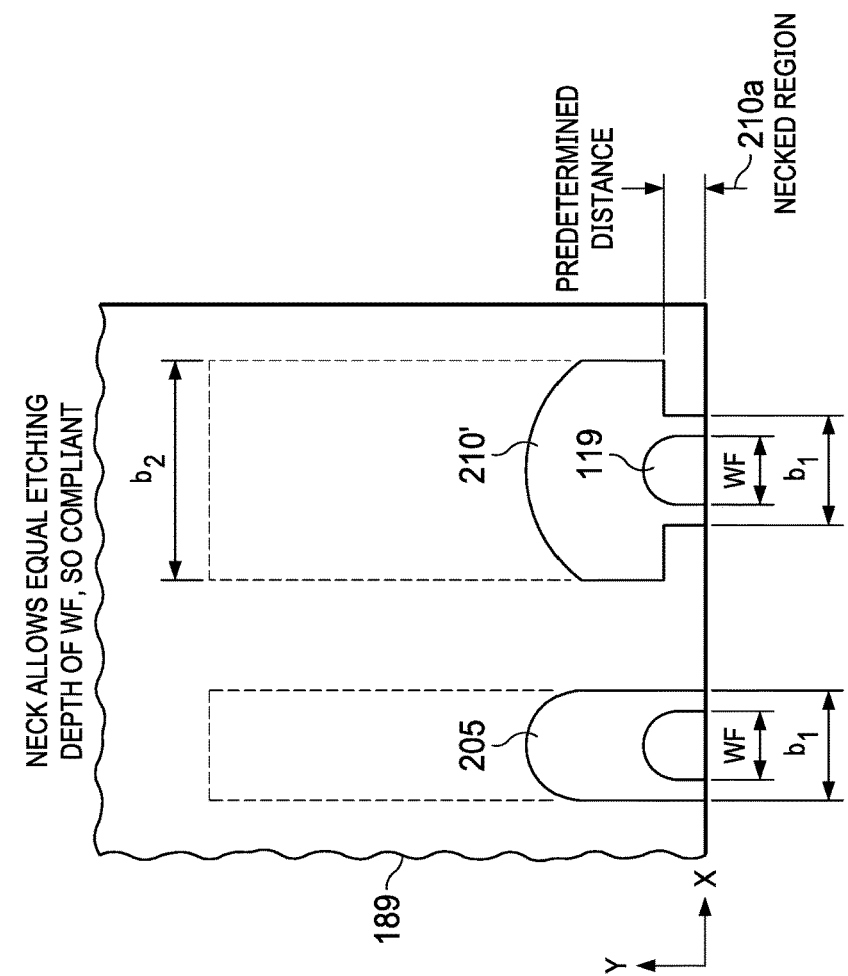
FIG. 2A depicts a simplified 2D bottom view in the XY plane showing an under etched and thus a non-compliant wider lead terminal.
Figure 2B:
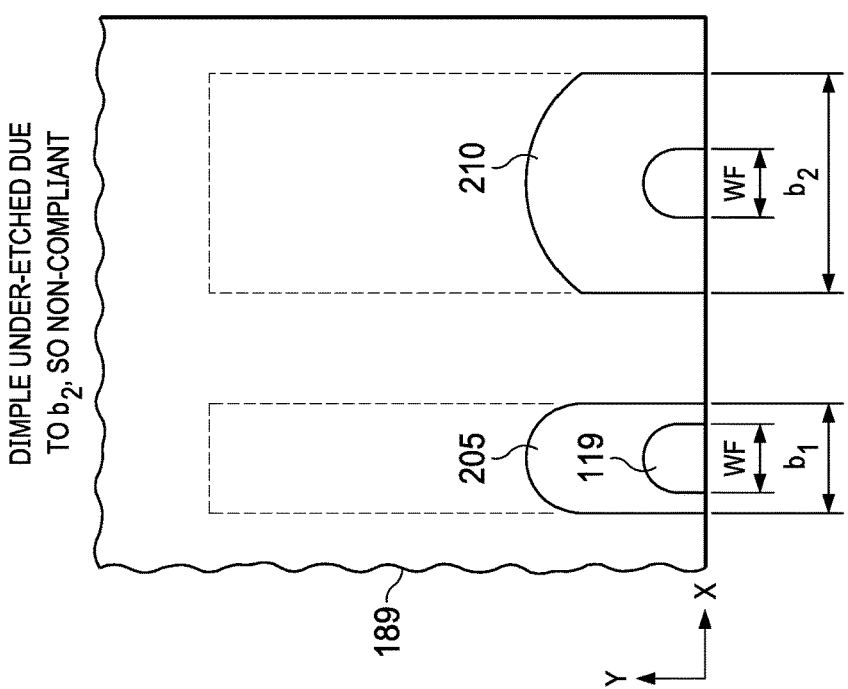
FIG. 2B depicts a simplified 2D bottom view in the XY plane of a compliant wider lead terminal using disclosed selective necking to form a necked region for the wider terminal that extends for the inward from a saw line edge of the package, according to an example aspect.

FIG. 2A depicts a simplified 2D bottom view in the XY plane showing an under etched and thus the wider lead terminal 210 is non-compliant, and FIG. 2B depicts a simplified 2D bottom view in the XY plane of a wider lead terminal 210' that is compliant which is enabled by using disclosed selective necking to form a necked region 210a for the wider terminal that extends for the inward from a saw line edge of the package. The plated wettable flank dimples 119 are again shown. The wider lead terminal 210 may have a b value shown as $b_2$ of say 0.5 units and the narrower lead terminal 205 may have a b value shown as $b_1$ of say 0.25 units. Mold compound is again shown as 189. In FIGS. 2A and 2B the lead terminal surfaces left exposed by the mold compound 189 are all plated to provide plated wettable flank dimples 119. Hidden features are shown as dashed lines. The narrower lead terminal 205 is the same in both FIGS. 2A and 2B having a constant $b_1$ throughout its length.

Although after dimple etching the narrower lead terminal 205 may meet the example customer requirement of WF≥0.5b, the wider lead terminal 210 shown in FIG. 2A would be under etched by the dimple etch so that it's WF/b ratio likely would not meet the example customer's requirements of WF≥0.5b and h>0.100 mm, and the packaged leadless device would thus be non-compliant. This is because the wettable flank dimples for the wider lead terminals such as the wider lead terminal 210 will not etch sufficiently during the dimple etch to meet the customer's example requirements without destroying the narrower lead terminal 205 due to over etching by etching through $b_1$, resulting in a scrapped device.

In FIG. 2B the wider lead terminal 210' after having disclosed necking before dimple etching to form the necked region 210a thus has a reduced b value shown as $b_1$ (same lead width as the narrower lead terminal 205) that extends inward from saw line in the applicable in-plane dimension (shown as Y) for a predetermined distance. The necked region 210a of the wider lead terminal 210' having a lead width $b_1$ extends inward for predetermined distance, such as for a distance of about 0.100 mm. The reduced width shown as $b_1$ within the predetermined distance for the wider lead terminal 210' is obtained by disclosed selective necking etch that extends inward over the predetermined distance from the edge of the package. The wettable flank dimple depth has a height h in the Z-direction(perpendicular to the XY plane),
and a dimple width WF which can be in one specific example 160 µm, or more generally any needed WF value to satisfy in this case WF≥0.5$b_1$. The h value for the wettable flank dimple can be essentially the same as the predetermined distance, or larger than or less than the predetermined distance.

Disclosed selective necking the wider lead terminals to form disclosed necked regions will also help indicate insufficient solder volume after assembly of the package device typically to a PCB by failure to form a solder fillet on affected lead(s). The disclosed necked region of wider lead terminals serve as a warning there was insufficient solder volume under the associated lead terminal, that is recognized to have increased detection sensitivity due to the necked region's 210a effect on solder surface tension "stealing" the fillet solder to the larger (original) width in the lead terminal region that is beyond the predetermined distance in the event of insufficient solder, as noted above referred to herein as the 'terminal region'.

As described above, disclosed selective necking is implemented as lead frame etching before the etching of the wettable flank dimples inward, typically from the saw street defined by fiducials located on the lead frame, because disclosed selective necking and dimple etching is implemented before forming the mold compound so that no saw line is present during such etchings. Disclosed selective necking of only the wider lead terminals to form disclosed necked regions with a reduced b value extending inward for the predetermined distance also allows the etch used to form the wettable flank dimples to provide a proper etching depth of h without an over etch of the narrower lead terminals or an under etch of the wider lead terminals. This disclosed solution is seen in FIG. 2B to meet the customer' requirement for wettable lead terminals for both the narrower lead terminal 205 and wider lead terminal 210' which both can be seen to satisfy WF>0.5b.

Figure 3A:
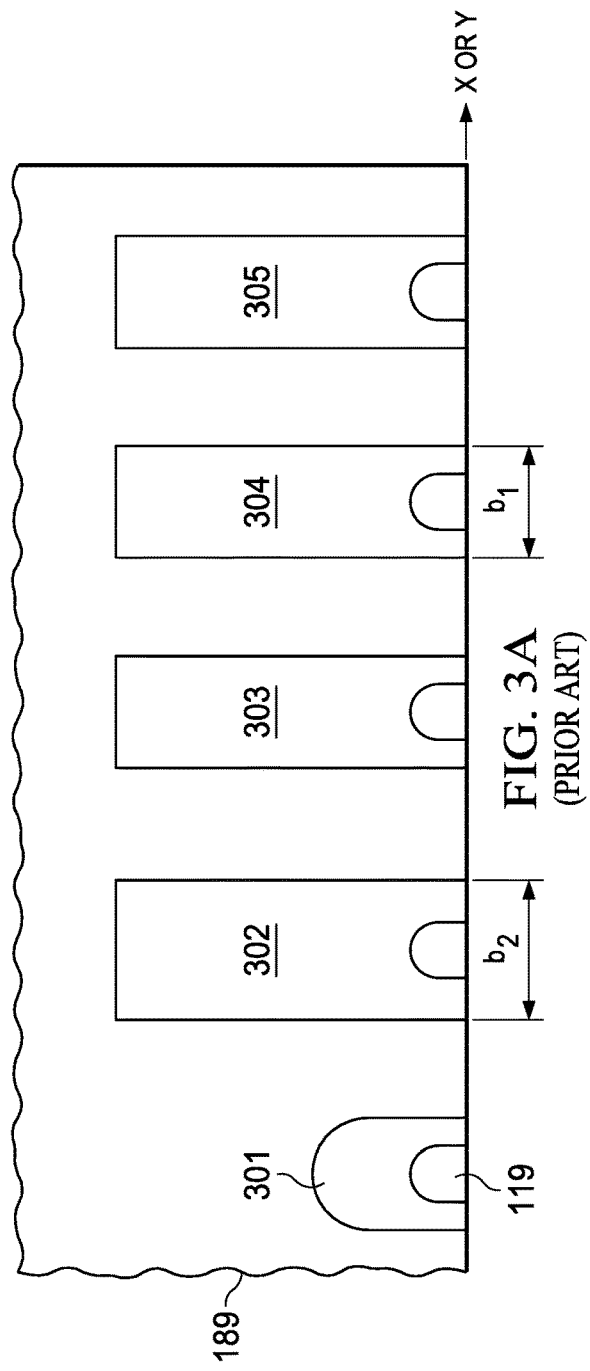
FIG. 3A and FIG. 3B show simplified 2D bottom views in the XY with FIG. 3B showing disclosed selective necking solutions being compatible with various lead terminal designs, each showing plated wettable flank dimples formed in the lead terminals.
Figure 3B:
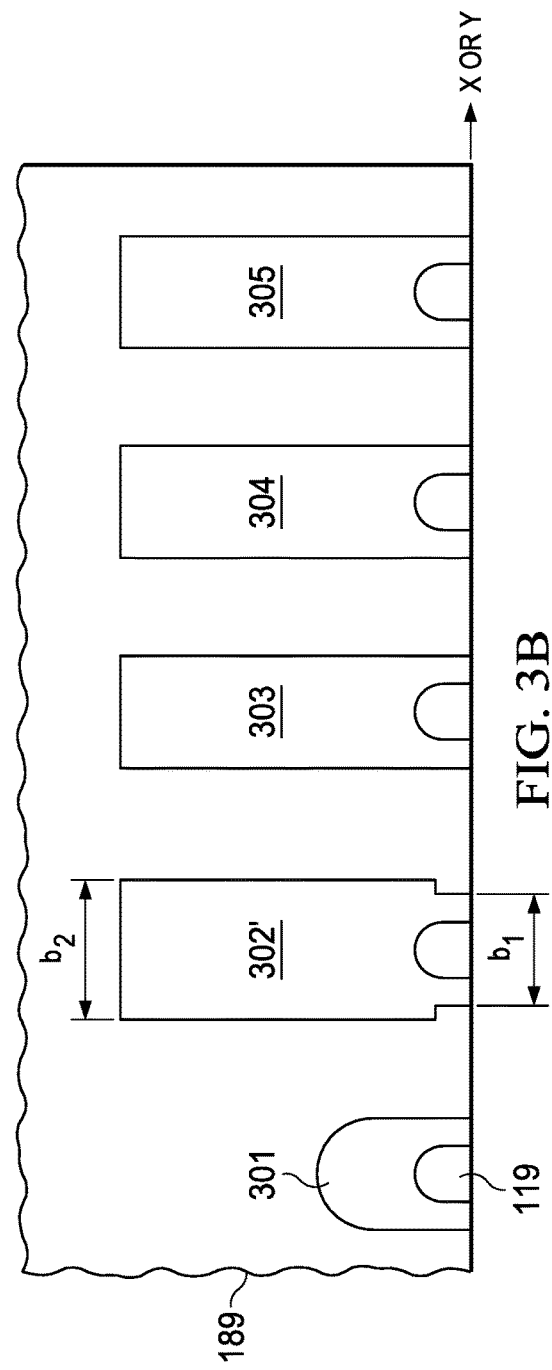

FIG. 3A and FIG. 3B show simplified 2D bottom views in the XY plane of portions of a leadless package device with FIG. 3B showing disclosed solutions are compatible with a variety of different lead terminal designs, each showing plated wettable flank dimples 119 formed in the lead terminals. FIG. 3A shows five lead terminals shown as 301, 302, 303, 304, and 305 on one side of an example leadless packaged device, with the wider lead terminal 302 having a width $b_2$, and the narrower lead terminals 301, 303-305 all having lead widths $b_1$. In FIG. 3B the wider lead terminal 302 having received a disclosed necking etch to form a necked region with a b value shown as $b_1$ matches the lead terminal width ($b_1$) of the narrower lead terminals 301, 303-305.

More generally, the wider lead terminal being selectively necking etched matches the b value of $b_1$ for the narrower lead terminals 301 and 303-305, so that the wider lead terminal 302' on its end beyond the predetermined distance matches $b_1$ and is shown on its end having width of $b_1$. Generally, the ends of the lead terminals within the predetermined distance are all in a distribution having a mean b value ±−15%. Accordingly, as a result of disclosed selective necking to form necked regions for the wider lead terminals, the b values are uniform across all lead terminals. Moreover, the subsequent etching to form the dimples for the plated wettable flank dimples 119 for all the lead terminals 301, 302', 303-305 for the packaged semiconductor device despite having wider terminals and narrower lead terminals can be seen to have a consistent/compliant h dimension and a consistent/compliant WF/b ratio.

Figure 4A:
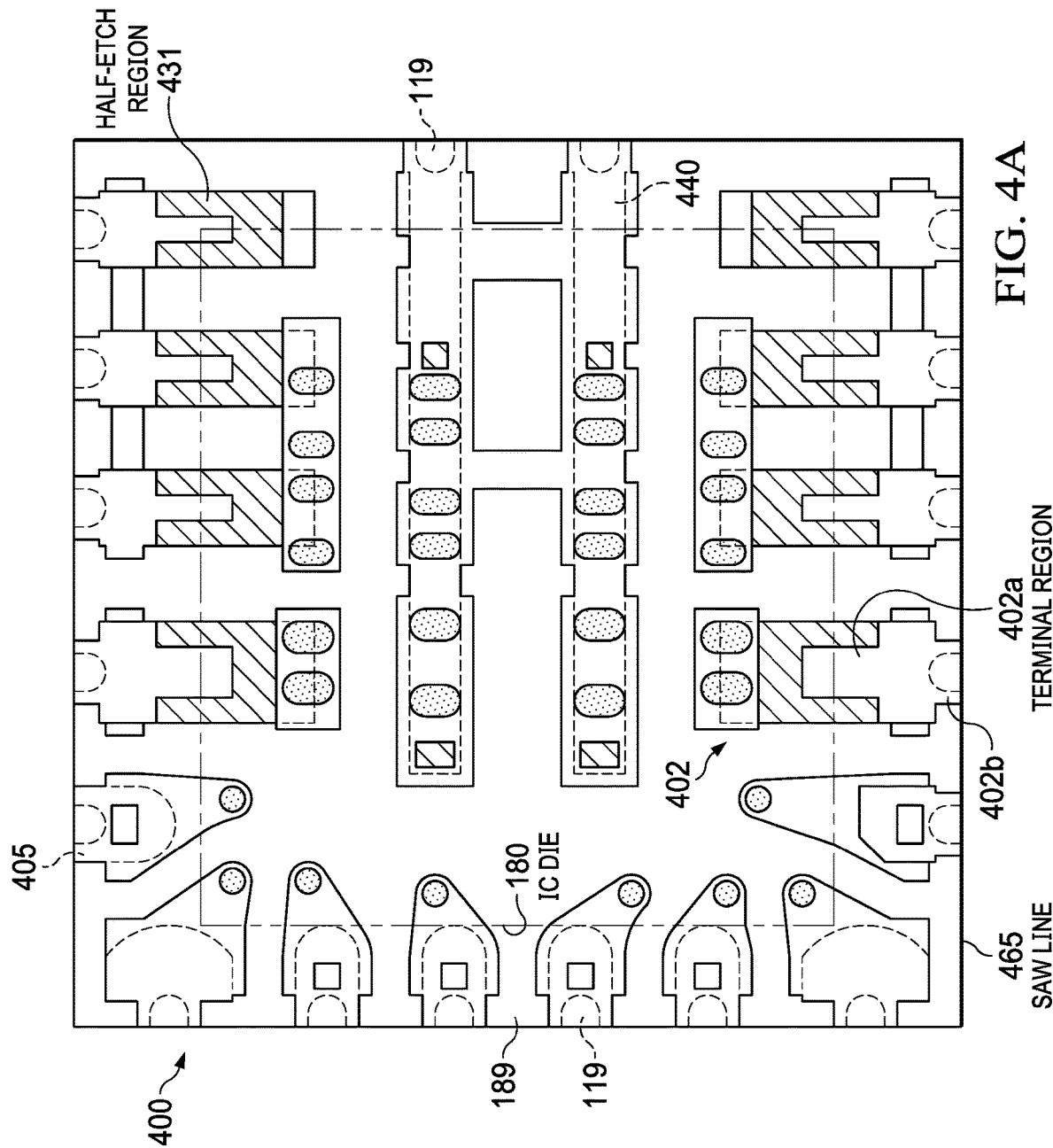
FIG. 4A and FIG. 4B are a top internal view and a bottom external view, respectively, of a packaged flip chip on lead packaged device having wider lead terminals that include disclosed necked regions.
Figure 4B:
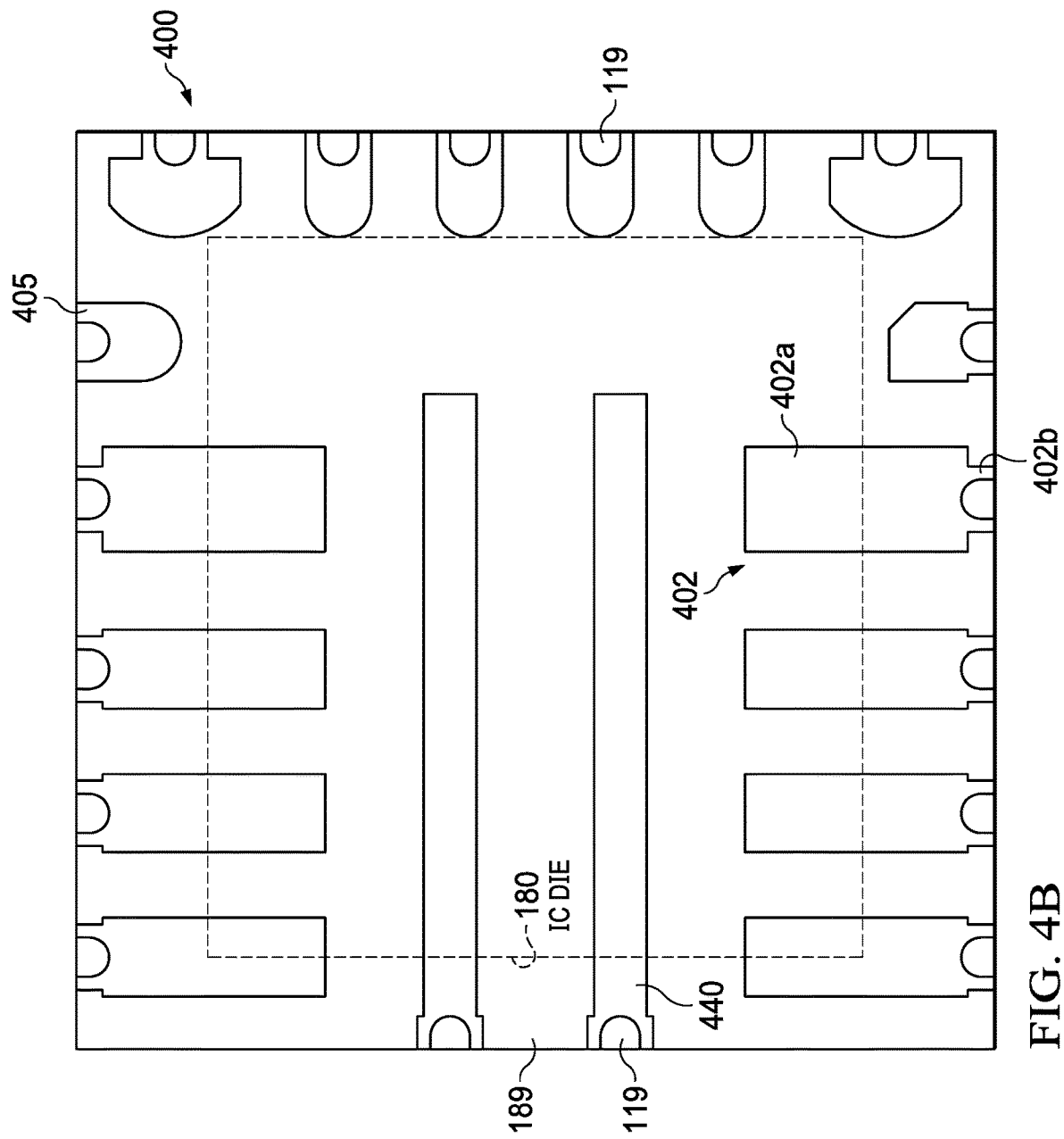

FIG. 4A and FIG. 4B are a top internal view and a bottom external view, respectively, of a packaged flip chip on lead QFN package (QFN package) 400 having both wider lead terminals and narrower lead terminals, with disclosed wider lead terminals that have necked regions, all lead terminals having plated wettable flank dimples 119. The saw line is shown as 465. Hidden geometry is depicted in dashed lines, so the plated wettable flank dimple 119 is dashed because the view is provided from the top side and the full metal thickness features of the lead terminals are also dashed. Features which are half thick metal shown as 431 that are generally etched from bottom side are shown as solid lines on lead frame. Diagonal hatch is etched from top side and fully exposed to the bottom view.

The wider lead terminals are all shown having disclosed necked regions 402b having a reduced width over the predetermined distance including lead terminal 402 and the long rectangular power providing bus bars shown as 440 that extends under the IC die 180, while the narrower lead terminals including lead terminal 405 are shown all lacking disclosed necking thus having a uniform b value along its length including within the predetermined distance. Lead terminal 402 has the necked region 402b may be selectively etched from the top side to half metal thickness as depicted by the diagonal hash marks, while the full width terminal region 402a can be seen to be significantly wider as compared to the necked region 402b. The QFN package 400 is shown as a 16 pin package. An IC die 180 is shown flip chip attached to lead terminals. As before the mold compound is shown as 189.

Figure 5A:
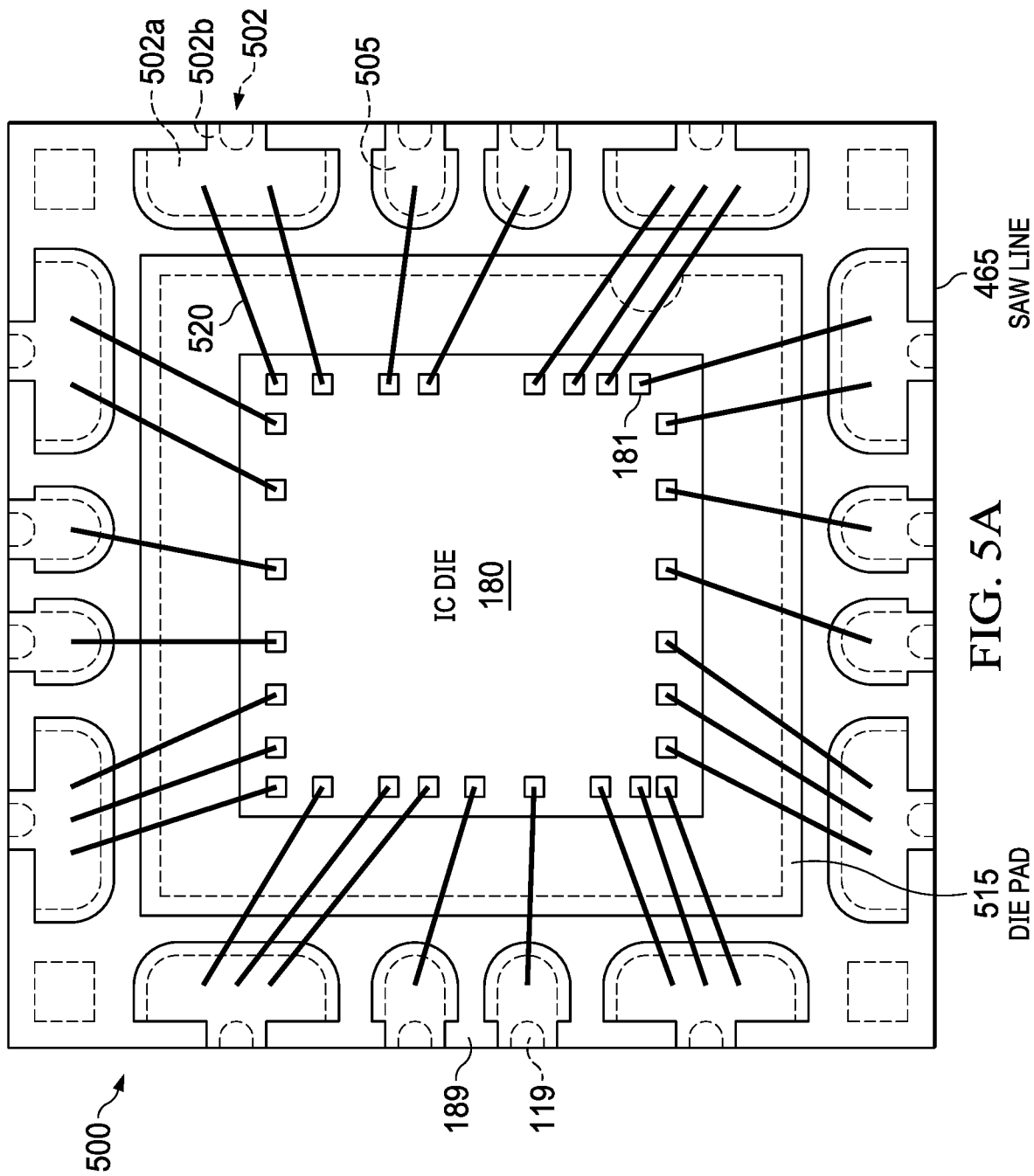
FIG. 5A and FIG. 5B are a top internal view and a bottom external view, respectively, of an example QFN packaged device with wire bonds having wider lead terminals that include disclosed necked regions.
Figure 5B:
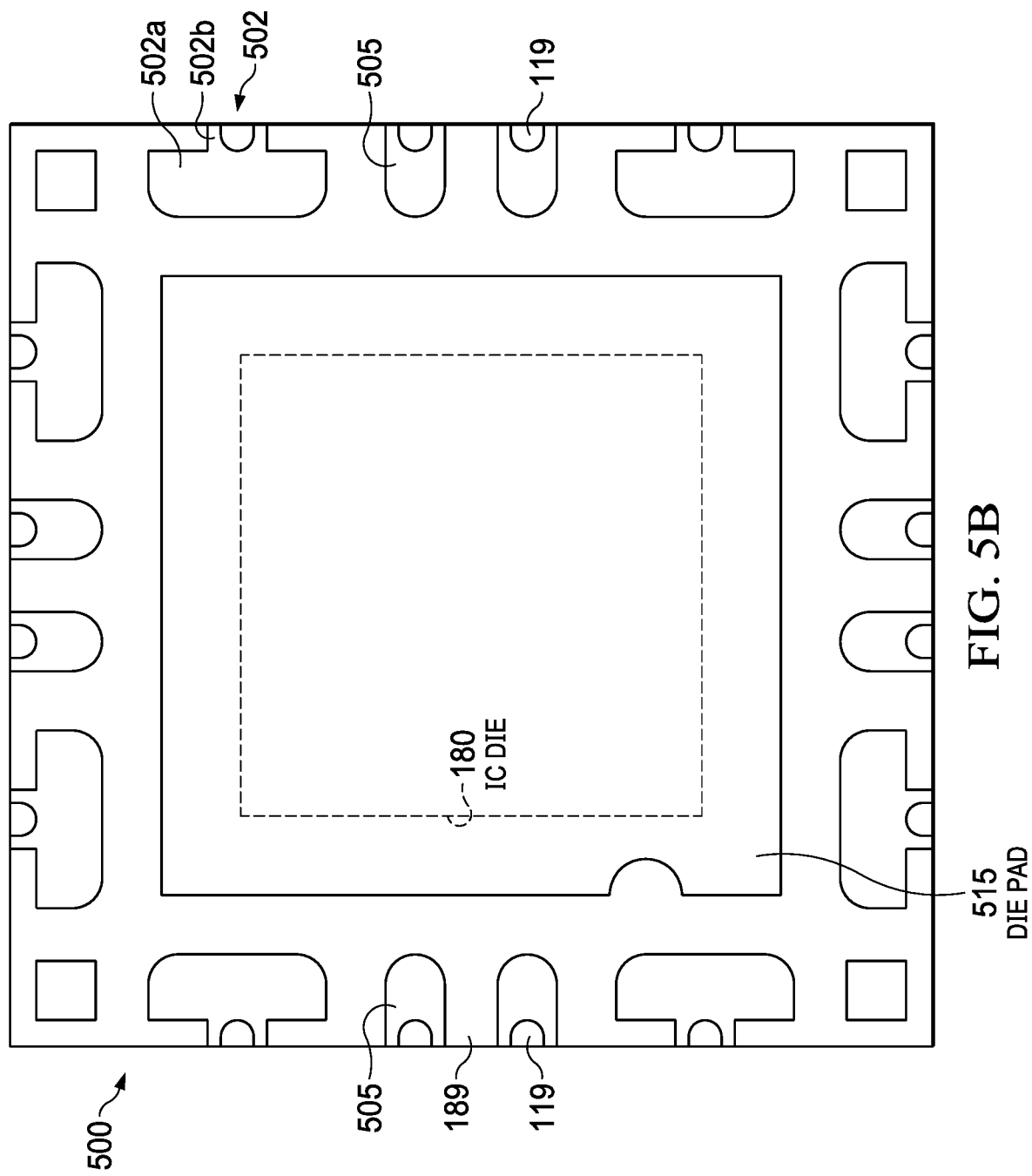

FIGS. 5A and 5B are a top internal view and a bottom external view of a QFN package 500 having both wider and narrower lead terminals, with the wider lead terminals having disclosed necked regions 502b having a reduced width over the predetermined distance, with wire bonds 520 between bond pads 181 on the IC die 180 and the lead terminals. A full width terminal region 502a is above the necked region 502b. The saw line is again shown as 465. The IC die 180 is attached by a suitable die attach material to a die pad 515. Hidden geometry is depicted in dashed lines, so that the plated wettable flank dimples 119 are shown dashed because the view provided is from top side, and the full metal thickness features of the lead terminals are also dashed.

The wider lead terminals including lead terminal 502 identified in FIGS. 5A and 5B are all shown having disclosed necking to have necked regions 502b that have a reduced b value are targeted to match the smaller width value of the narrower lead terminals 505 where the necked regions as described above extend inward a predetermined distance. In contrast the narrower lead terminals 505 have a uniform width throughout including within the predetermined distance where the wider lead terminals have necked regions 502b. Disclosed necking for the wider lead terminals 502 as described above enables the WF/b ratios to match despite having wider lead terminals and narrower lead terminals, which as described above enables wettable flank dimples to be formed having an essentially constant h value, and an acceptable WF/b ratio for all lead terminals.

Proof disclosed selective necking of the wider lead terminals to form necked regions before forming the wettable flank dimples is helpful may be evidenced by standard wire-bonded lead frames where the etched wettable flank dimple is consistently created in the correct dimensions with the lead terminal width being held constant by disclosed necking of the wider lead terminals over the predetermined distance. As described above this disclosed lead frame design feature provides a constant lead terminal width over only the predetermined distance inward from the package edge thus being provided in only a localized area, and then allows the lead terminal width to expand inward beyond the predetermined distance as needed for the specific circuit design. Disclosed necking selectively for the wider lead terminals is easily identifiable in completed packaged devices, including visually.

Disclosed aspects can be integrated into a variety of assembly flows to form a variety of different leadless packaged semiconductor devices and related products. The assembly can comprise single semiconductor die or multiple semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including but not limited to bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A packaged semiconductor device, comprising:
a lead frame including a plurality of lead terminals each having a plated wettable flank dimple including two or more different widths including narrower lead terminals and wider lead terminals;
a semiconductor die attached to the lead frame;
a mold material terminating at a saw line on outer edges of the packaged semiconductor device providing encapsulation except for an exposed bottom contact and an exposed sidewall contact for each of the plurality of lead terminals;
wherein the wider lead terminals have:
a necked region with a reduced width extending inward a predetermined distance from the saw line, and
a terminal region inward beyond the necked region which is wider as compared to the necked region.

2. The packaged semiconductor device of claim 1, wherein the plated wettable flank dimples have a dimple depth of at least 100 μm, and wherein each of the plurality of lead terminals satisfies a dimple width dimension (WF) to lead terminal width (b) ratio of greater than or equal to 0.5.

3. The package semiconductor device of claim 1, wherein measured from the saw line to the predetermined distance the plurality of lead terminals have a lead width that are all within a distribution with a mean width value (±) 15%.

4. The packaged semiconductor device of claim 1, wherein the predetermined distance is at least 0.100 mm measured from the saw line.

5. The packaged semiconductor device of claim 1, wherein the lead frame further comprises a die pad, wherein the semiconductor die is mounted top side up on the die pad, further comprising wire bonds connecting bond pads on the semiconductor die to the plurality of lead terminals.

6. The lead frame of claim 1, wherein the wider lead terminals beyond the predetermined distance are at least 50% wider as compared to a lead width of the narrower lead terminals.

7. The packaged semiconductor device of claim 6, wherein the wider lead terminals beyond the predetermined distance are at least two times wider as compared to a lead width of the narrower lead terminals.

8. The packaged semiconductor device of claim 1, wherein the plated flank dimples across the plurality of lead terminals have a height dimension within a distribution with a mean height value ±5%, and a dimple width dimension (WF) within a distribution with a mean width for the flank dimples of ±5%.

9. A packaged semiconductor device, comprising:
a plurality of lead terminals including narrower lead terminals and wider lead terminals each, of the plurality of lead terminals having a plated flank dimple;
a semiconductor die spaced from the plurality of lead terminals;
a mold material terminating at a saw line on outer edges of the packaged semiconductor device providing encapsulation except for an exposed bottom contact and an exposed sidewall contact for each of the plurality of lead terminals;
wherein the wider lead terminals have:
a necked region with a reduced width extending inward a predetermined distance from the saw line, and
a terminal region inward beyond the necked region which is wider as compared to the necked region.

10. A semiconductor package assembly, comprising:
a plurality of lead terminals including wider lead terminals and narrower lead terminals;
a reduced lead width along a length dimension of only the wider lead terminals to a predetermined distance inwards from an outer edge of the wider lead terminals to form necked regions; and
plated wettable flank dimples in the plurality of lead terminals.

11. The semiconductor package assembly of claim 10, further comprising:
a semiconductor die electrically coupled to respective ones of the plurality of lead terminals; and
a mold compound covering the semiconductor die and at least a portion of the plurality of lead terminals.

12. The semiconductor package assembly of claim 10, wherein the outer edge of the wider lead terminals is determined from a saw street, and wherein each of the plurality of lead terminals satisfies a dimple width dimension (WF) to lead terminal width (b) ratio of greater than or equal to 0.5.

13. The semiconductor package assembly of claim 10, wherein the necked regions are at least partially etched regions.

14. The semiconductor package assembly of claim 11, further comprising a die pad, wherein the semiconductor die is mounted topside up on the die pad and further comprising wire bonds connecting bond pads on the semiconductor die to the respective ones of the plurality of lead terminals.

15. The semiconductor package assembly of claim 10, wherein the wider lead terminals beyond the predetermined distance are at least 50% wider as compared to a width of the narrower lead terminals.

16. The semiconductor package assembly of claim 10, wherein the flank dimples are plated with a plating metal material comprises NiPdAu.

17. The semiconductor package assembly of claim 10, wherein the wider lead terminals beyond the predetermined distance are at least two times wider as compared to a lead width of the narrower lead terminals.

18. The semiconductor package assembly of claim 10, wherein the wettable flank dimples across the plurality of lead terminals, have a height dimension within a distribution with a distribution a mean height value ±5%, and a width dimension distribution with a mean width for the flank dimples of ±5%.

19. A semiconductor package assembly, comprising:
lead terminals having a first width and lead terminals having a second width, the second width being less that the first width, each lead terminal having a plated wettable flank dimple; and
a neck etching a predetermined distance inwards from an outer edge of the lead terminals having a first width to form necked regions.

20. The semiconductor package assembly of claim 19, further comprising:
a semiconductor die adjacent the lead terminals having a first width and the lead terminals having a second width; and
a mold compound covering the semiconductor die and at least a portion of the lead terminals having a first width and lead terminals having a second width.

21. The semiconductor package assembly of claim 19, wherein the outer edge of the lead terminals having a first width is determined from a saw street, and wherein each of the lead terminals includes the wettable plated flank dimple having a dimple width dimension (WF), and each of the lead terminals satisfy a dimple width dimension (WF) to lead terminal width (b) ratio of greater than or equal to 0.5.

22. The semiconductor package assembly of claim 20, further comprising a die pad, wherein the semiconductor die is mounted topside up on the die pad, further comprising wire bonds connecting bond pads on the semiconductor die to respective ones of the lead terminals.

* * * * *